(12) United States Patent
Forster et al.

(10) Patent No.: US 7,730,606 B2
(45) Date of Patent: Jun. 8, 2010

(54) MANUFACTURING METHOD FOR A WIRELESS COMMUNICATION DEVICE AND MANUFACTURING APPARATUS

(76) Inventors: Ian J Forster, 31 Great Cob, Chelmsford, Essex (GB) CM1 6LA; Patrick F King, 418 N. Park Blvd., Glen Ellyn, IL (US) 60137

( * ) Notice: Subject to any disclaimer, the term of this patent is extended or adjusted under 35 U.S.C. 154(b) by 906 days.

(21) Appl. No.: 11/468,749

(22) Filed: Aug. 30, 2006

(65) Prior Publication Data

US 2007/0060223 A1    Mar. 15, 2007

Related U.S. Application Data

(62) Division of application No. 10/422,616, filed on Apr. 24, 2003, now Pat. No. 7,191,507.

(60) Provisional application No. 60/375,249, filed on Apr. 24, 2002.

(51) Int. Cl.
*B23P 19/00* (2006.01)
*G08B 13/14* (2006.01)

(52) U.S. Cl. .............................. 29/729; 29/592; 29/600; 29/737; 29/738; 29/739; 340/572.2

(58) Field of Classification Search .................... 29/600, 29/601, 593, 729, 592, 739, 737, 738; 343/700 MS, 343/700 R, 767; 340/572.7, 572.8, 572.2; 156/260, 205, 247; 83/149, 193, 284, 305, 83/56, 88
See application file for complete search history.

(56) References Cited

U.S. PATENT DOCUMENTS

| 3,741,651 A | 6/1973 | Nishiyama |
| 3,961,323 A | 6/1976 | Hartkorn |
| 3,972,049 A | 7/1976 | Kaloi |
| 4,051,480 A | 9/1977 | Reggia et al. |

(Continued)

FOREIGN PATENT DOCUMENTS

DE    3247 425 A1    1/1987

(Continued)

OTHER PUBLICATIONS

"AT5510 Transportation Tag," Intermec Technologies Corporation, 2 pages, Sep. 1999.
"BiStatix Whitepaper, Version 4.1," *BiStatix Technology*, <http://www.motorola.com/LMPS/Indala/bistatix.htm> [retrieved Jul. 31, 2000], pp. 1-10.

(Continued)

*Primary Examiner*—Minh Trinh
*Assistant Examiner*—Tai Nguyen
(74) *Attorney, Agent, or Firm*—Christensen O'Connor Johnson Kindness PLLC

(57) ABSTRACT

A method for manufacturing wireless communication devices for use in tracking or identifying other items comprises a number of cutting techniques that allow the size of the antenna for the wireless communication device. Further, the chip for the wireless communication device is nested so as to be flush with the surface of the substrate of the wireless communication device. Rollers cut the tabs that form the antenna elements. In a first embodiment, a plurality of rollers are used, each one effecting a different cut whose position may be phased so as to shorten or lengthen the antenna element. In a second embodiment, the rollers are independently positionable to shorten or lengthen the antenna element.

41 Claims, 17 Drawing Sheets

U.S. PATENT DOCUMENTS

| | | |
|---|---|---|
| 4,086,598 A | 4/1978 | Bogner |
| 4,117,489 A | 9/1978 | Kaloi |
| 4,278,186 A | 7/1981 | Williamson |
| 4,433,336 A | 2/1984 | Carr |
| 4,575,725 A | 3/1986 | Tresselt |
| 4,587,524 A | 5/1986 | Hall |
| 4,670,757 A | 6/1987 | Munich et al. |
| 4,673,923 A | 6/1987 | Boscoe et al. |
| 4,694,283 A | 9/1987 | Reeb |
| 4,782,345 A | 11/1988 | Landt |
| 4,846,922 A | 7/1989 | Benge |
| 4,850,020 A | 7/1989 | Kahn |
| 4,857,893 A | 8/1989 | Carroll |
| 4,873,532 A | 10/1989 | Sakurai et al. |
| 4,900,386 A | 2/1990 | Richter-Jörgensen |
| 4,947,181 A | 8/1990 | Duncan et al. |
| 4,975,711 A | 12/1990 | Lee |
| 5,006,857 A | 4/1991 | DeHart |
| 5,055,968 A | 10/1991 | Nishi et al. |
| 5,073,971 A | 12/1991 | Schaeffer |
| 5,155,493 A | 10/1992 | Thursby et al. |
| 5,187,489 A | 2/1993 | Whelan et al. |
| 5,216,430 A | 6/1993 | Rahm et al. |
| 5,216,435 A | 6/1993 | Hirata et al. |
| 5,255,819 A | 10/1993 | Peckels |
| 5,298,894 A | 3/1994 | Cerny et al. |
| 5,315,303 A | 5/1994 | Tsou et al. |
| 5,339,074 A | 8/1994 | Shindley et al. |
| 5,347,280 A | 9/1994 | Schuermann |
| 5,376,943 A | 12/1994 | Blunden et al. |
| 5,381,137 A | 1/1995 | Ghaem et al. |
| 5,430,441 A | 7/1995 | Bickley et al. |
| 5,448,220 A | 9/1995 | Levy |
| 5,461,393 A | 10/1995 | Gordon |
| 5,495,218 A | 2/1996 | Erb et al. |
| 5,507,411 A | 4/1996 | Peckels |
| 5,508,706 A | 4/1996 | Tsou et al. |
| 5,512,901 A | 4/1996 | Chen et al. |
| 5,539,414 A | 7/1996 | Keen |
| 5,541,399 A | 7/1996 | de Vall |
| 5,566,441 A * | 10/1996 | Marsh et al. .................. 29/600 |
| 5,574,470 A | 11/1996 | de Vall |
| 5,584,113 A | 12/1996 | Hovorka |
| 5,585,953 A | 12/1996 | Zavrel |
| 5,592,182 A | 1/1997 | Yao et al. |
| 5,600,333 A | 2/1997 | Justice et al. |
| 5,603,430 A | 2/1997 | Loehrke et al. |
| 5,621,419 A | 4/1997 | Meek et al. |
| 5,635,917 A | 6/1997 | Todman |
| 5,656,115 A | 8/1997 | Tanno et al. |
| 5,678,301 A | 10/1997 | Gochnour |
| 5,691,731 A | 11/1997 | van Erven |
| 5,764,196 A | 6/1998 | Fujimoto et al. |
| 5,774,876 A | 6/1998 | Woolley et al. |
| 5,790,029 A | 8/1998 | Curnutte et al. |
| 5,814,797 A | 9/1998 | Rifkin |
| 5,821,859 A | 10/1998 | Schrott et al. |
| 5,826,175 A | 10/1998 | Schmidt et al. |
| 5,829,121 A * | 11/1998 | Shoemaker et al. ........... 29/600 |
| 5,864,323 A | 1/1999 | Berthon |
| 5,892,486 A | 4/1999 | Cook et al. |
| 5,914,640 A | 6/1999 | Nasserbakht |
| 5,922,550 A | 7/1999 | Everhart et al. |
| 5,929,760 A | 7/1999 | Monahan |
| 5,929,813 A | 7/1999 | Eggleston |
| 5,929,820 A | 7/1999 | Caulfield et al. |
| 5,936,528 A | 8/1999 | Kobayashi et al. |
| 5,945,201 A | 8/1999 | Holat |
| 5,960,961 A | 10/1999 | Gutentag |
| 5,972,152 A * | 10/1999 | Lake et al. .................. 156/247 |
| 5,972,156 A | 10/1999 | Brady et al. |
| 5,973,600 A | 10/1999 | Mosher, Jr. |
| 5,973,648 A | 10/1999 | Lindenmeier et al. |
| 5,995,048 A | 11/1999 | Smithgall et al. |
| 6,008,727 A | 12/1999 | Want et al. |
| 6,018,299 A | 1/2000 | Eberhardt |
| 6,018,324 A | 1/2000 | Kitchener |
| 6,019,865 A | 2/2000 | Palmer |
| 6,023,244 A | 2/2000 | Snygg et al. |
| 6,025,802 A | 2/2000 | Eggleston et al. |
| 6,027,027 A | 2/2000 | Smithgall |
| 6,027,622 A | 2/2000 | Graser et al. |
| 6,031,503 A | 2/2000 | Preiss, II et al. |
| 6,036,810 A | 3/2000 | Holat |
| 6,043,746 A | 3/2000 | Sorrells |
| 6,045,652 A | 4/2000 | Tuttle et al. |
| 6,054,961 A | 4/2000 | Gong et al. |
| 6,057,803 A | 5/2000 | Kane et al. |
| 6,075,493 A | 6/2000 | Sugawara et al. |
| 6,078,259 A * | 6/2000 | Brady et al. ............. 340/572.7 |
| 6,082,030 A | 7/2000 | Kesselring et al. |
| 6,087,940 A | 7/2000 | Caperna et al. |
| 6,089,458 A | 7/2000 | Lake |
| 6,094,173 A | 7/2000 | Nylander |
| 6,100,804 A | 8/2000 | Brady et al. |
| 6,114,962 A | 9/2000 | Wiklof et al. |
| 6,118,426 A | 9/2000 | Albert et al. |
| 6,140,966 A * | 10/2000 | Pankinaho ........... 343/700 MS |
| 6,155,098 A | 12/2000 | Shapiro et al. |
| 6,182,828 B1 | 2/2001 | Hiruta |
| 6,214,444 B1 | 4/2001 | Uchibori |
| 6,239,765 B1 | 5/2001 | Johnson et al. |
| 6,243,013 B1 | 6/2001 | Duan et al. |
| 6,243,031 B1 | 6/2001 | Jusuf et al. |
| 6,249,260 B1 | 6/2001 | Holloway |
| 6,259,369 B1 | 7/2001 | Monico |
| 6,278,413 B1 | 8/2001 | Hugh et al. |
| 6,305,609 B1 | 10/2001 | Melzer et al. |
| 6,385,407 B1 | 5/2002 | Inose |
| 6,451,154 B1 | 9/2002 | Grabau |
| 6,483,473 B1 | 11/2002 | King |
| 6,538,569 B1 | 3/2003 | Dunn |
| 6,853,345 B2 | 2/2005 | King |
| 6,925,701 B2 | 8/2005 | Eckstein |
| 7,191,507 B2 | 3/2007 | Forster |
| 7,228,662 B1 | 6/2007 | John |
| 7,353,598 B2 | 4/2008 | Craig |

FOREIGN PATENT DOCUMENTS

| | | |
|---|---|---|
| DE | 4446 203 A1 | 6/1996 |
| DE | 195 00 925 A1 | 7/1996 |
| DE | 100 16 037 A1 | 10/2001 |
| EP | 0 615 285 A2 | 9/1994 |
| EP | 0 855 675 A2 | 7/1998 |
| EP | 1085480 A1 | 3/2001 |
| FR | 2 785 072 A1 | 10/1998 |
| GB | 2 335 081 A | 9/1999 |
| JP | 03 196704 | 8/1991 |
| JP | 6175264 | 6/1994 |
| JP | 09 330388 | 12/1997 |
| JP | 10249250 | 9/1998 |
| JP | 11 121538 A | 4/1999 |
| WO | WO 94/14208 A1 | 6/1994 |
| WO | WO 99/65002 A1 | 12/1999 |
| WO | WO 02/07085 A1 | 1/2002 |

OTHER PUBLICATIONS

"Conductive Polystyrene Carrier Tape Stock," *Tekpak.com*, © 1998, 1999 Tek Pak Inc., 7 pages.

Small, D.J., and B. Eisenach, "Electrically Conductive Adhesives: Characteristics and Applications," *Technical Paper*, Loctite Corporation, 7 pages, Sep. 1998.

* cited by examiner

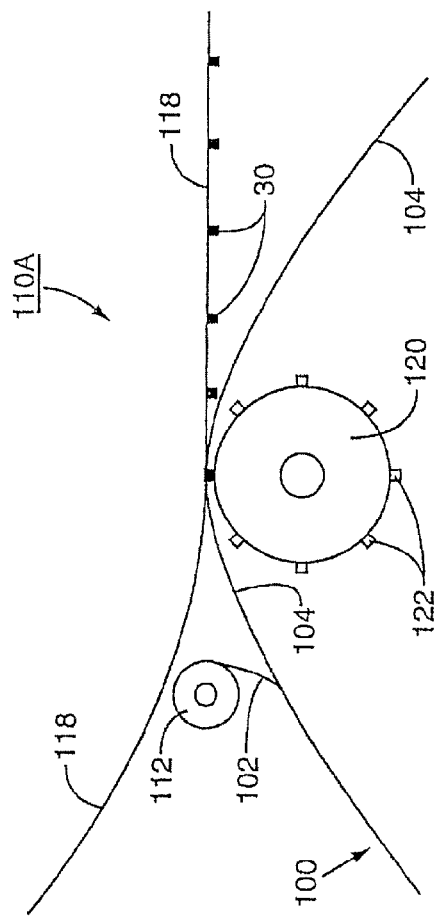
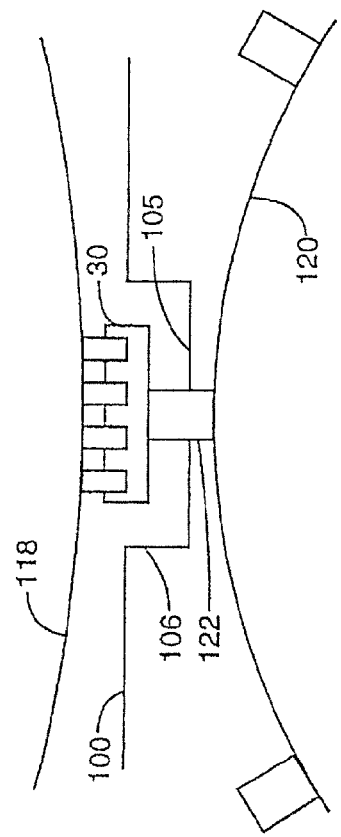
FIG. 4
FIG. 5

MANUFACTURING METHOD FOR A WIRELESS COMMUNICATION DEVICE AND MANUFACTURING APPARATUS

RELATED APPLICATION

This application claims priority and the benefit of U.S. Provisional Patent Application Ser. No. 60/375,249 filed Apr. 24, 2002, which is incorporated by reference herein in its entirety.

FIELD OF THE INVENTION

The present invention relates to a method of manufacturing a wireless communication device for use in communication of information concerning an item containing the wireless communication device.

BACKGROUND OF THE INVENTION

It is often desired to track and identify items, such as packages, containers, and the like, and to communicate information concerning such items wirelessly. One method of tracking and providing information concerning packages is to attach a wireless communication device, such as a radio frequency identification (RFID) transponder or other identification device, to packages or items. The information communicated concerning the packages or items may include an expiration date, "born on" date or date of manufacture, lot number, tracking information, or other manufacturing information, and the like. A wireless communication device may be attached to an individual package, to a container containing multiple packages, or other item as the situation merits.

Recent advances in the miniaturization of wireless communication electronics have enabled the creation of small chips, containing integrated circuits, that are well suited for use in these wireless communication devices. However, these chips still need antennas to communicate to a remotely positioned interrogator. Numerous potential antennas exist that may be coupled to the chip for this purpose.

It is expected that the demand for such devices will rapidly increase as industries realize the versatility and utility of the wireless communication devices. To meet this demand, automated manufacturing processes are needed. Further, the process contemplated should provide a wireless communication device well suited for integration with the item to be tracked and one that may have the ability to communicate at multiple frequencies if desired.

SUMMARY OF THE INVENTION

In a first aspect, the present invention provides a number of embodiments designed to pick up chips from a carrier tape and position the chips on an adhesive production line for later incorporation into a wireless communication device.

A second aspect that may be used in conjunction with the first aspect comprises a combination of positioning a conductive material on a roll, cutting the conductive material to the desired shape, and peeling the conductive material from an underlying carrier material. In one embodiment of this aspect, a single roller performs the entire cut. In a second embodiment of this aspect, three separate rollers perform different cuts, allowing the size of the tabs created to be varied as needed or desired.

A second aspect, that may be used in conjunction with the first aspect comprises a combination of positioning a conductive material on a roll, cutting the conductive material to the desired shape, and peeling the conductive material from an underlying carrier material. In one embodiment of this aspect, a single roller performs the entire cut. In a second embodiment of this aspect, three separate rollers perform different cuts, allowing the size of the tabs created to be varied as needed or desired.

Another aspect comprises using two selectively spaced rollers to adjust the size of the tab created. In an exemplary embodiment, a testing device may assess the capacitance of the elements of the dipole with a ground layer or without a ground layer to give an estimate of the thickness and/or dielectric constant of the substrate to which the chip is being applied. Each roller may be moved independently, increasing or decreasing the size of the tab while assessing the effective capacitance until a desired value is achieved for maximum antenna performance. Upon reaching the desired values, the tabs are cut to create the antenna.

As yet another aspect, the present invention may insert a wireless communication chip into a substrate such that the chip does not protrude from the surface of the substrate. An exemplary embodiment includes punching a hole in the substrate, positioning tabs to form a dipole antenna overlapping the newly formed hole, and positioning the chip in the hole. The chip may be attached to the tabs by a low melting point solder, a conductive adhesive, welding, or a mechanical bond.

The aspects are mutually cooperative and allow a roll-to-roll manufacturing process to be automated for the creation of the wireless communication devices.

BRIEF DESCRIPTION OF THE DRAWINGS

FIG. 4 illustrates a side schematic view of a second technique to position chips on an adhesive production line;

FIG. 5 illustrates a more detailed view of the interface between the roller and the carrier tape of FIG. 4;

DETAILED DESCRIPTION OF THE INVENTION

The present invention is a method of manufacturing wireless communication devices such as those used in co-pending, commonly assigned U.S. patent application Ser. Nos. 09/678,271 and 09/678,630, entitled "Wireless Communication Device and Method" and "Multi-Band Wireless Communication Device and Method" respectively, both of which were filed on Oct. 3, 2000 and are incorporated herein by reference in their entireties. In particular, the present invention allows variations in the size of the tabs used for antenna elements in the wireless communication devices.

Some wireless communications devices have both transmit and receive capability and can be used in the present invention. A typical example of such a device is described in U.S. Pat. No. 5,585,953 entitled "IR/RF radio transceiver and method," incorporated herein by reference in its entirety. Other wireless communication devices have receive capability and use the energy received to communicate back, such as described in U.S. Pat. No. 6,078,259 entitled "Radio frequency identification tag," incorporated herein by reference in its entirety. Such passive devices may likewise be used with the present invention. The wireless communication device in the present invention can be any type of device that allows reception of wireless electronic communications and is able to communicate in response thereto. Both types of wireless communication devices are sometimes referred to herein and in the art as transponders. The terms are used equivalently herein.

Figure 1:
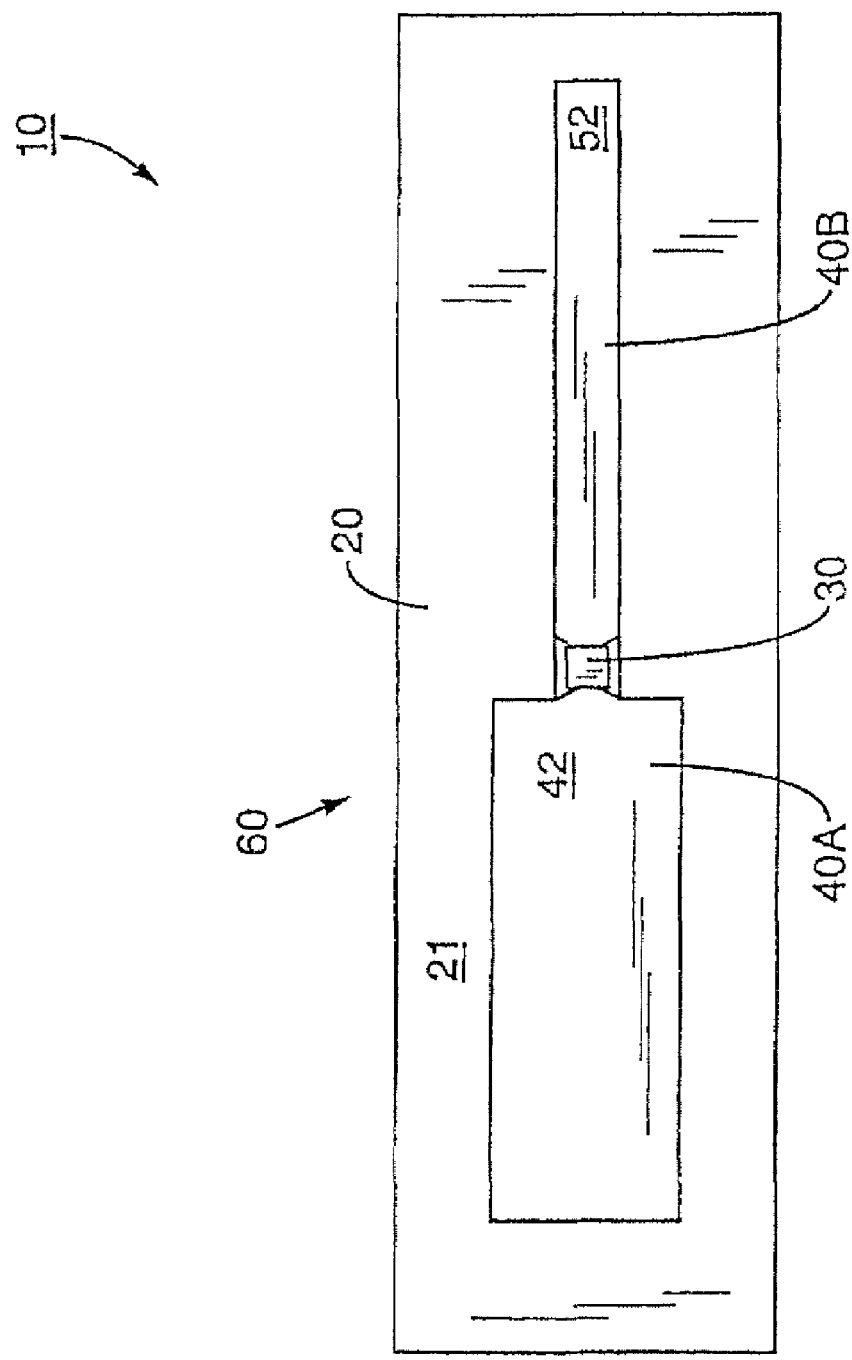
FIG. 1 illustrates a top plan view of a wireless communication device assembled according to the present invention.

FIG. 1 illustrates a wireless communication device 10, such as that described in the previously incorporated applications. In particular, wireless communication device 10 comprises a substrate 20, a wireless communication chip 30, and one or more tabs 40, to serve as an antenna 60 for wireless communication device 10. Tabs 40A, 40B may be constructed out of any type of material so long as the material is conductive. Such material may be a ferrous material, including metal, steel, iron, or the material may be aluminum or other type of conducting material.

Tabs 40 may also be constructed from a tape impregnated with metal loaded ink, as described in U.S. Pat. No. 5,566,441, entitled "Attaching an electronic circuit to a substrate," incorporated herein by reference in its entirety. In one embodiment of the present invention, as illustrated in FIG. 1, tabs 40A, 40B are made from a foil tape 42, 52 respectively as is well understood in the art.

An optional ground plane (not shown) may be oppositely positioned on substrate 20 if needed or desired. Substrate 20 may be almost any material, but is most likely a plastic or similar material.

Wireless communication chip 30 may comprise a device from INTERMEC as used in their Intellitag® labels and those devices from SCS as used in their DL100 label although other devices are certainly possible, especially in light of the present invention's suitability to both active and passive wireless communication devices 10. Wireless communication chip 30 may comprise a controller, memory, a battery, a sensor, and other conventional components such as those described in the previously incorporated applications.

Tabs 40A, 40B together comprise dipole antenna 60. In this particular embodiment, tabs 40A, 40B are asymmetrical with respect to one another to form an asymmetrical dipole antenna. An asymmetrical dipole antenna 60 is an antenna having a first tab 40A, or first pole, different in shape, including, but not necessarily limited to length, width, volume, and/or density, from the second tab 40B, or second pole.

Tabs 40A, 40B may also be coupled to a slot to form a slot antenna (not shown). Alternatively, a single tab 40 may be used as a monopole antenna given the appropriate ground plane (not shown). While the present invention is primarily directed to dipole antenna tab structures, it should be appreciated by those in the art that some of the techniques may be equally applicable to a single tab 40 arrangement, or an arrangement having more than two tabs 40A, 40B.

The present invention focuses on techniques to manufacture these wireless communication devices 10. There are several different aspects to the manufacturing process. The first is properly positioning the wireless communication chip 30 for later processing, and is discussed in the chip positioning section below. The second is the creation of the tabs 40 that form the antenna 60, addressed in a separate section below. The last is the merging of the chip 30 with the antenna 60 to form the wireless communication device 10, discussed in the mounting techniques section below.

Chip Positioning Techniques

Figure 2:
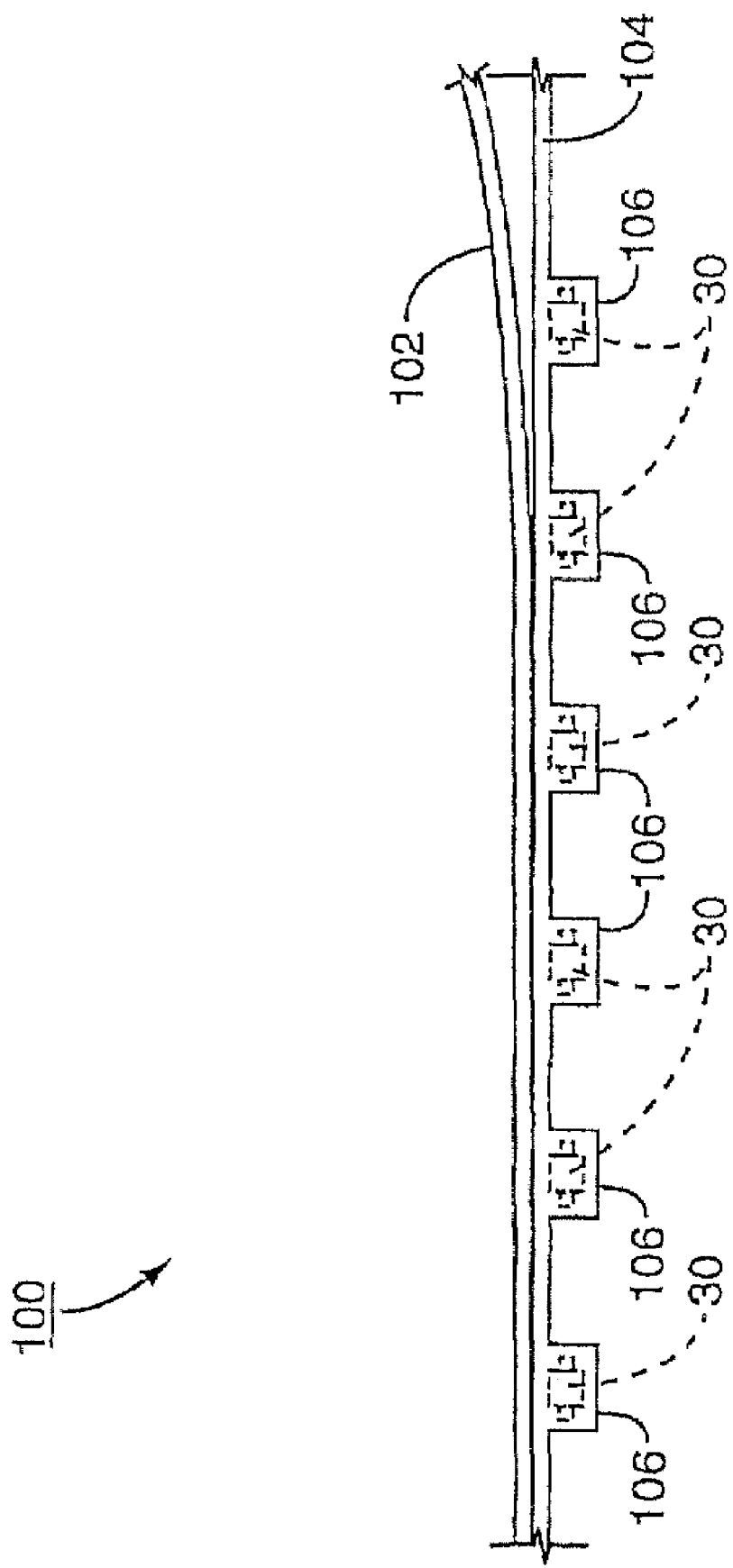
FIG. 2 illustrates a side elevational view of a carrier tape loaded with wireless communication chips.

FIG. 2 illustrates an exemplary carrier tape 100 comprising an adhesive sealing layer 102 and a container layer 104. Container layer 104 comprises a plurality of containers or pockets 106 having wireless communication chips 30 disposed therein. Carrier tape 100 may be made from any number of materials and is available from a number of manufacturers such as Tek Pak. Details can be found at www.tekpak.com. Adhesive sealing layer 102 initially seals the chips 30 within the containers 106, protecting them from environmental vagaries. Subsequently, when desired, adhesive sealing layer 102 peels off of container layer 104, leaving the contents of the containers 106 exposed for further processing.

There are two specifically contemplated techniques to remove the chips 30 from the carrier tape 100 for later mounting on the wireless communication device 10. Other techniques are also contemplated to enable the roll-to-roll continuous automation process of the present invention.

Figure 3:
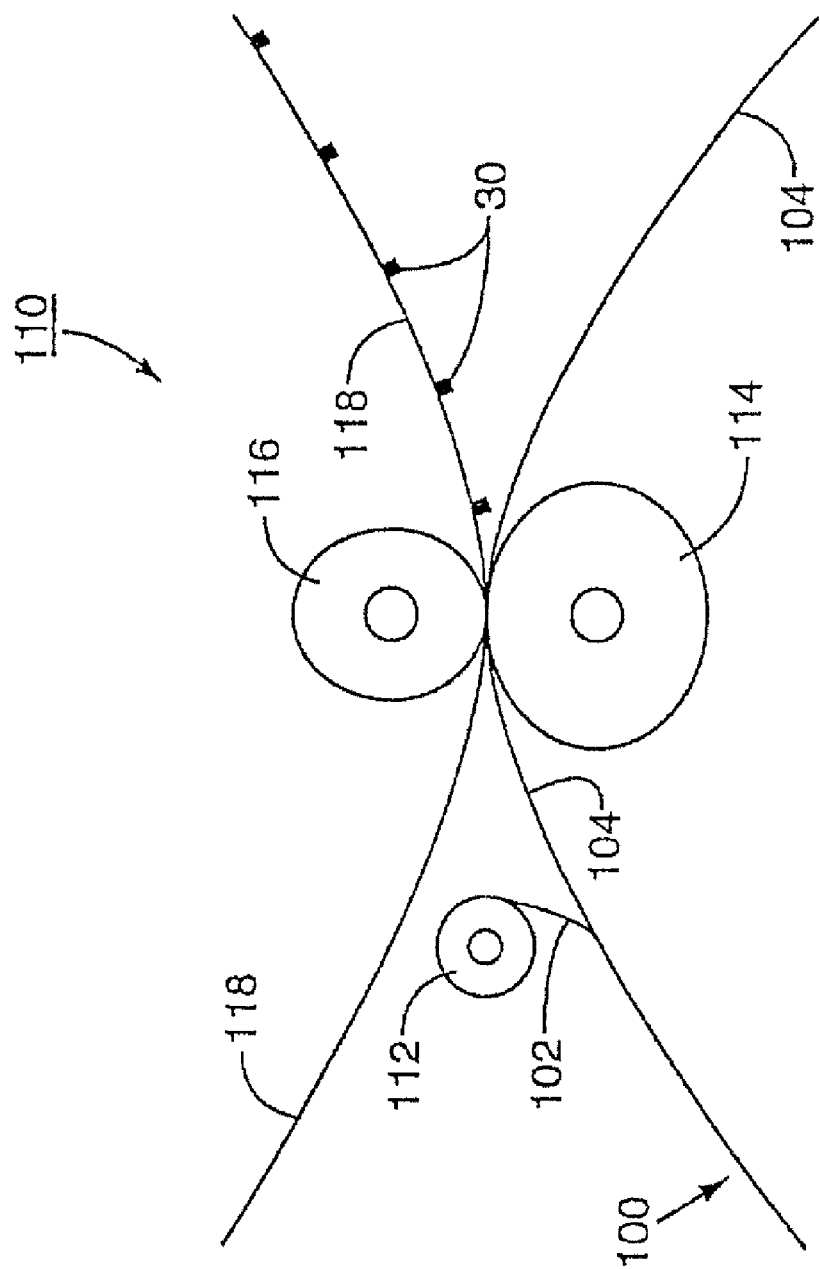
FIG. 3 illustrates a side schematic view of a first technique to position chips on an adhesive production line.

A first technique is illustrated in FIG. 3. Chip positioning system 110 comprises a waste roller 112, a first roller 114, and a second roller 116. Carrier tape 100 is fed to rollers 114, 116 simultaneously with an adhesive line 118. Waste roller 112 wraps adhesive scaling layer 102 therearound, exposing chips 30 within the containers 106 (FIG. 1). Rollers 114, 116 may be oval shaped and rotate at a frequency so as to space chips 30 appropriately on adhesive line 118. The proximity of the roller 114 to roller 116 pushes the chip 30 out of the container 106 and to the sticky surface of the adhesive line 118. This removes the chip 30 from the container 106 and allows the adhesive line 118 with the chips 30 to be passed downstream for further processing.

A second technique is illustrated in FIGS. 4 and 5. As illustrated in FIG. 4, chip positioning system 110A comprises a waste roller 112, a toothed roller 120 having teeth 122 and may have an optional second roller (not shown) comparable to second roller 116. Carrier tape 100 is fed to the roller 120 with waste roller 112 removing the adhesive sealing layer 102 as previously described. Now with reference to FIG. 5, wherein a more detailed view of the interface between the teeth 122, the containers 106, the chips 30, and the adhesive line 118 is illustrated, it can be seen that a tooth 122 pushes through the floor 105 of the container 106, pushing chip 30 upwardly to contact the adhesive line 118. Again, this removes the chip 30 from the container 106 and allows the adhesive line 118 with the chips 30 to be passed downstream for further processing.

Manufacture of Tabs for Antenna

Concurrent to the positioning of the chips 30 on the adhesive line 118, tabs 40 may be created for the wireless communication device 10. This section focuses on techniques by which the tabs 40 may be created that are again well suited for use in the roll-to-roll automated manufacturing process of the present invention.

Figure 6:
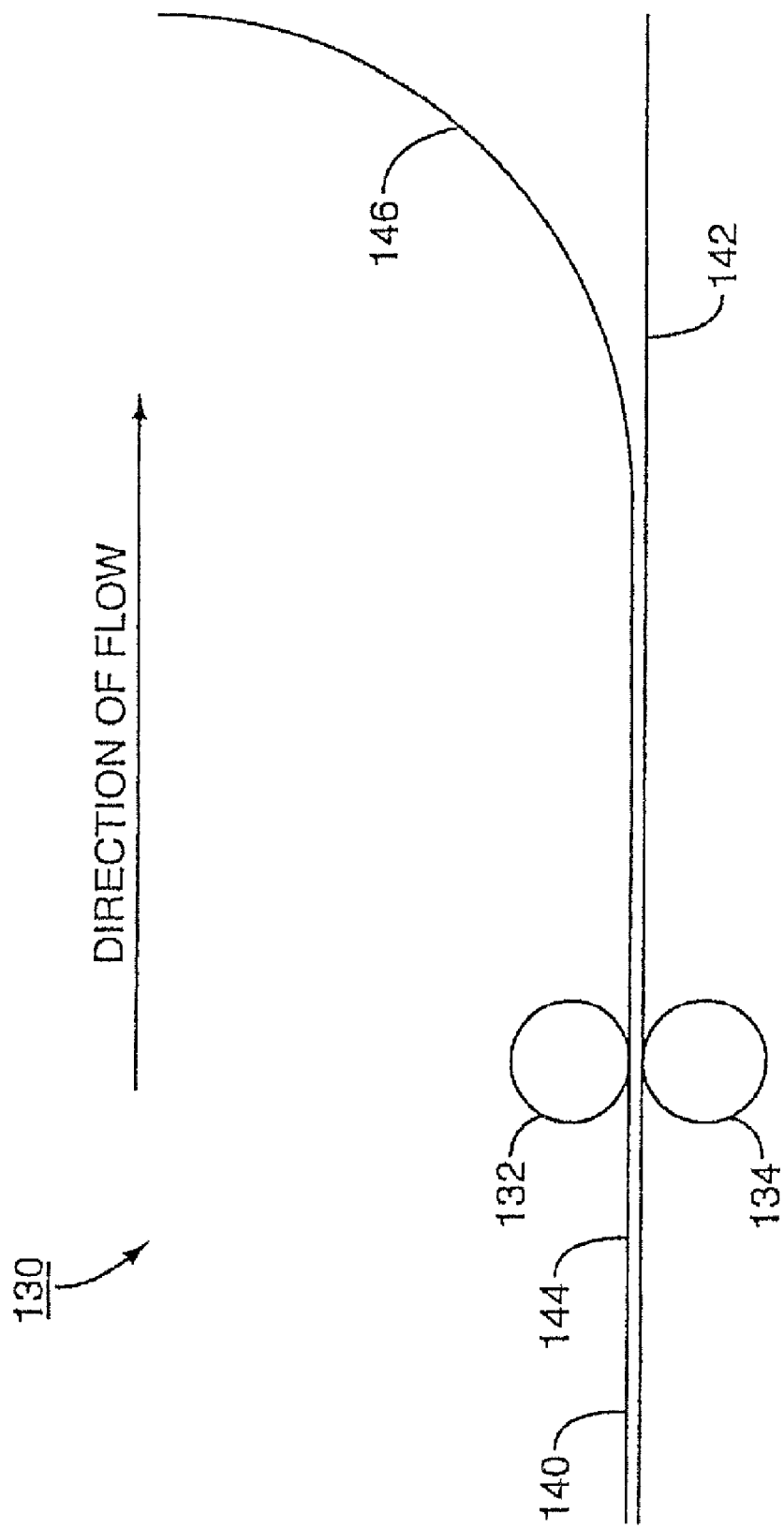
FIG. 6 illustrates a side view of a first cutting technique for creating antenna elements for wireless communication devices.
Figure 7:
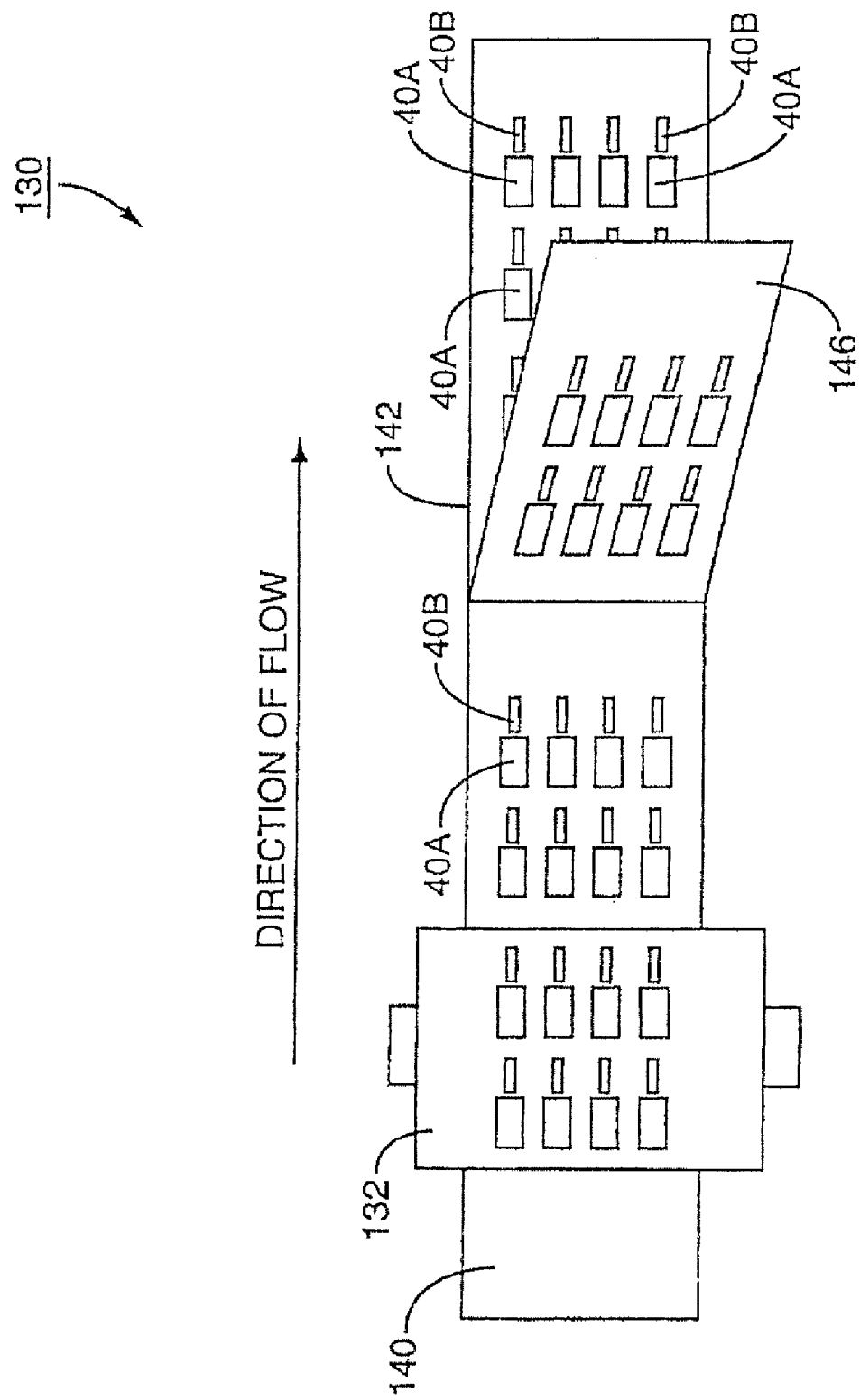
FIG. 7 illustrates a top view of the first cutting technique of FIG. 6.

A first technique for the creation of tabs 40A, 40B is illustrated in FIGS. 6 and 7. FIG. 6 illustrates a tab production system 130, comprising a pair of rollers 132, 134 oppositely positioned on either side of a production line 140. Top roller 132 may comprise a die cutting roller while bottom roller 134 may be a driving roller to push material though rollers 132, 134. It should be appreciated that rollers 132, 134 may be reversed if production line 140 is inverted. Production line 140 may also comprise a backing layer 142, an adhesive (not shown explicitly) and a conductive foil 144, such as a copper foil, an aluminum foil, or the like. As production line 140 passes through rollers 132, 134, die cutting roller 132 cuts conductive foil 144 into one or more tabs 40. In this particular embodiment, die cutting roller 132 cuts conductive foil 144 into two tabs 40A, 40B. Waste foil 146 is peeled from backing layer 142 while tabs 40A, 40B and backing layer 142 continue for further processing. Tabs 40 are then used to form antenna elements for antenna 60 on the wireless communication device 10 as explained below.

To accommodate substrates 20 that may have varying dielectric constants and/or thicknesses (such as may occur when switching materials having different dielectric constants forming substrate 20) variations may need to be made to the dimensions of tabs 40A, 40B to produce the optimum read range at the desired operating frequency. To ensure optimal antenna 60 performance using tabs 40A, 40B with chip 30, energy transfer should be maximized between chip 30 and tabs 40A, 40B to maximize emitted radiation from tabs 40A, 40B. To ensure maximum energy transfer, the impedance of tabs 40A, 40B must be substantially matched to the impedance of chip 30.

Further information on impedance matching between wireless communication devices and antennas is described in the previously incorporated U.S. patent application Nos. 09/678,271 and 09/678,630, and co-pending U.S. patent application No. 10/125,786 entitled "Tuning techniques for a slot antenna," filed on Apr. 18, 2002, filed by the same assignee as that of the present application and incorporated herein by reference in its entirety.

Figure 8:
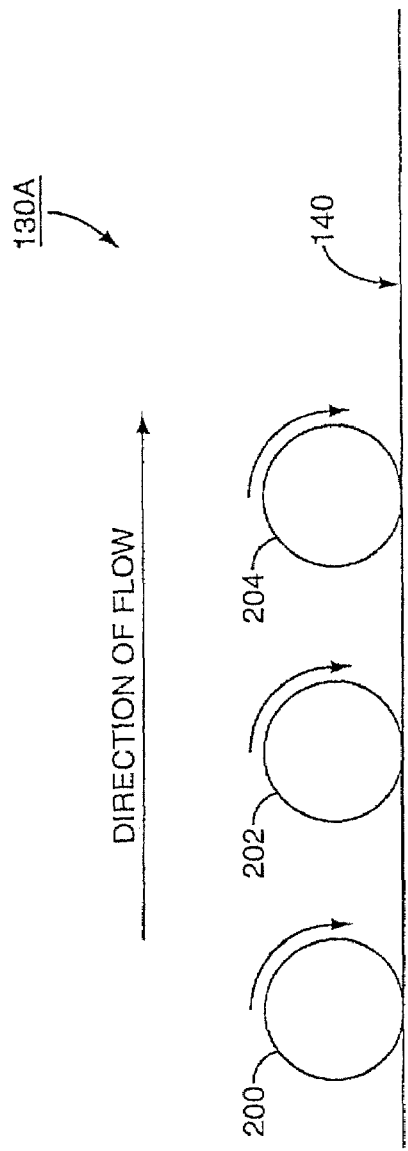
FIG. 8 illustrates a side view of a second cutting technique for creating antenna elements for wireless communication devices.
Figure 9:
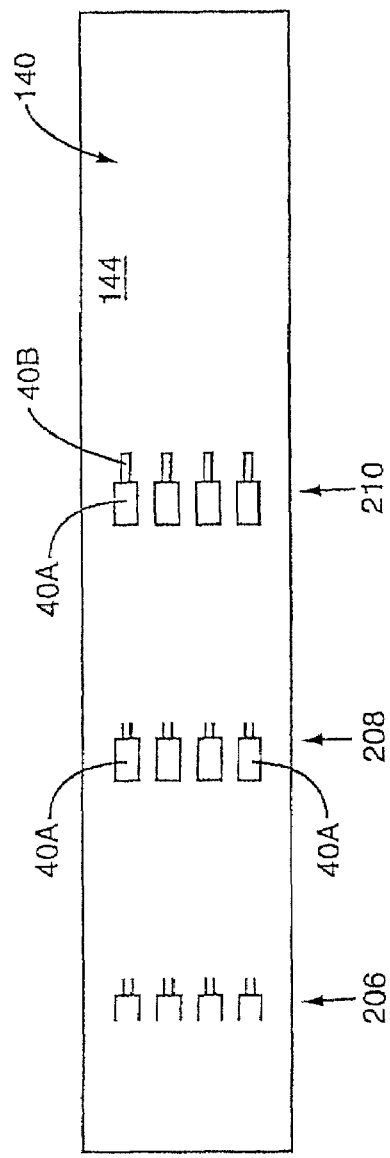
FIG. 9 illustrates a top view of the laminate during different stages of the cutting of FIG. 8.

A first technique to address this situation is illustrated in FIGS. 8 and 9. In this technique, a plurality of rollers 200, 202, 204 is used. In particular, tab production system 130A receives production line 140. A first roller 200 makes an initial cut 206 in conductive foil 144. This initial cut 206 comprises the inner portions of tabs 40A, 40B. A second roller 202 makes a second cut 208 in conductive foil 144 that completes the creation of one of tabs 40A, 40B (in this case tab 40A). Second cut 208 overlaps to a certain extent initial cut 206 of first roller 200. A third roller 204 makes a third cut 210 in conductive foil 144 that completes the creation of the other one of tabs 40A, 40B (in this case tab 40B). Third cut 210 overlaps to a certain extent the initial cut 206 of first roller 200. Note that the precise order of the cutting by rollers 200, 202, 204 may be varied. For example, a first cut could begin on the left edge, beginning tab 40A, a second cut ends tab 40A and begins tab 40B, and the third cut ends tab 40B. Other variations are also contemplated.

The technique of FIGS. 8 and 9 allows the sizes of the tabs 40A, 40B to be varied by varying the phases of rollers 202, 204 with respect to first roller 200. Thus, if a longer tab 40A is desired, second roller 202 is phased such that there is little overlap between the cuts 206, 208. If a shorter tab 40A is desired, second roller 202 is phased such that there is substantial overlap in the cuts 206, 208. The same principle applies to the size of tab 40B, but the phase of third roller 204 is modified to achieve the desired amount of overlap between the cuts 206, 210. Allowing for differently sized tabs 40A, 40B allows optimal antenna 60 performance as previously explained. It should be appreciated that rollers 200, 202, 204 rotate at the same rate to avoid undesired phase changes between rollers 200, 202, 204. This technique is especially well suited for situations in which substrate 20 varies between wireless communication devices 10. In one embodiment, it is expected that at a 200 ft/min rate of movement of production line 120, and an antenna 60 dimension of approximately 68 mm×16 mm outside dimensions, thus giving about 60 antennas 60 per foot, approximately 12,000 antennas may be made per minute.

An alternate technique to provide variations in the size of tabs 40A, 40B is illustrated in FIGS. 10-13B. In this technique, production system 130B comprises a first roller 300 and a second roller 302, each of which is independently movable relative to one another. This technique is better suited for situations in which substrate 20 on which wireless communication device 10 is to be placed varies, as this technique allows testing on the fly to get the desired impedance for antenna 60 in conjunction with substrate 20. Rollers 300, 302 receive a production line 140A (illustrated in FIG. 13A) comprising a backing material 130 with tabs 40A, 40B, and chip 30 disposed thereon. In contrast to the other techniques previously discussed, this technique positions, but does not specifically require, chip 30 mounted with the elements that form tabs 40.

Figure 10:
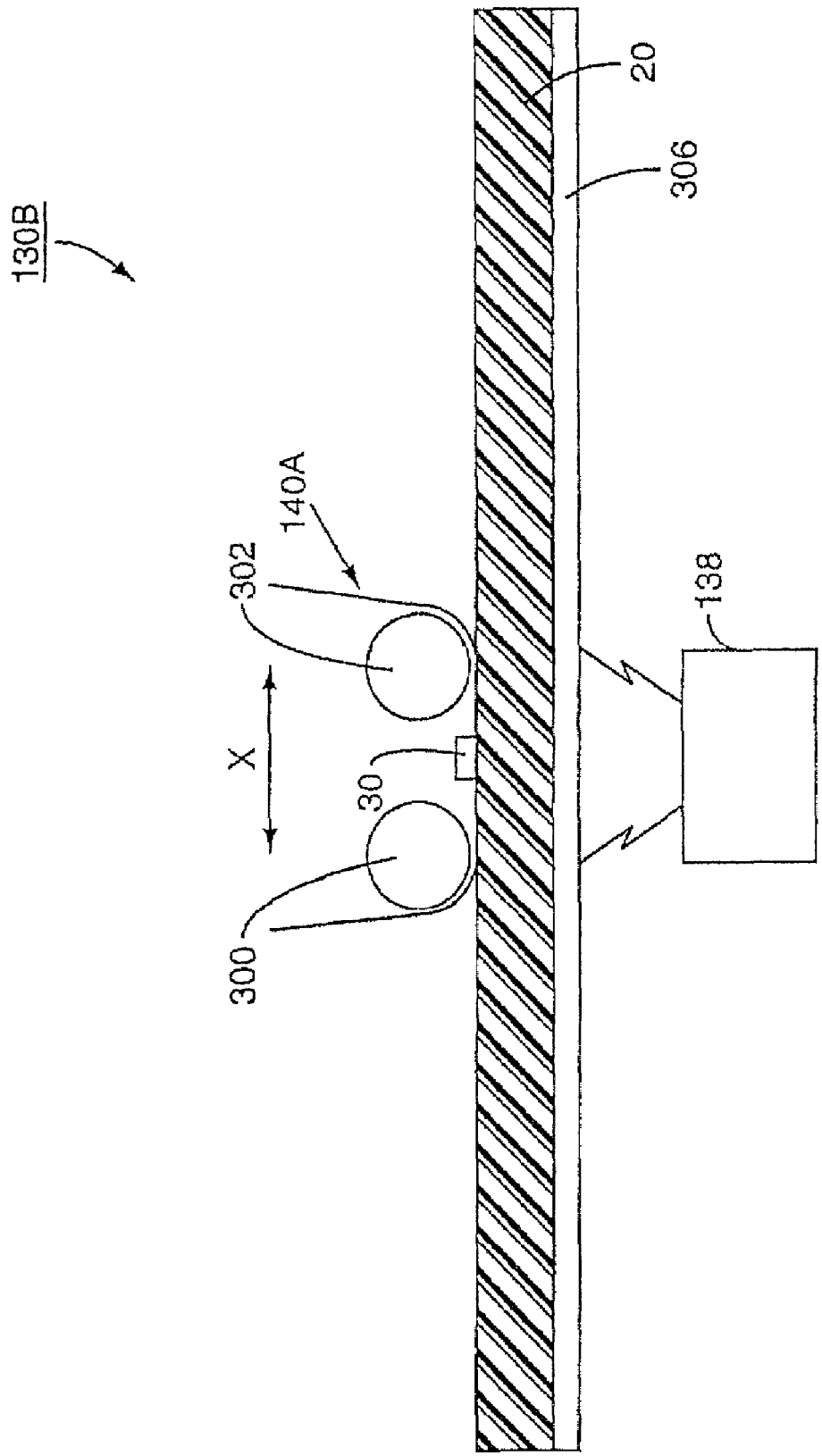
FIG. 10 illustrates a side view of a third cutting technique for creating antenna elements for wireless communication devices.

Production line 140A passes under first roller 3000 and second roller 302 to deposit the tabs 40 and the chip 30 onto the substrate 20. Rollers 300 and 302 may initially be close together as illustrated by dimension 'X' in FIGS. 10 and 11. During the deposit of tabs 40A, 40B on substrate 20, a low signal level and low frequency radiator 138, operating at, for example, 125 kHz, assesses the capacitance of tabs 40A, 40B in conjunction with substrate 20 and with or without ground plane 306 (FIG. 10). This provides an estimate of the thickness and dielectric constant of substrate 20. Tabs 40A, 40B may be sized appropriately to provide the desired capacitance by moving the rollers 300, 302 to insure optimal antenna 60 performance as previously discussed.

Figure 11:
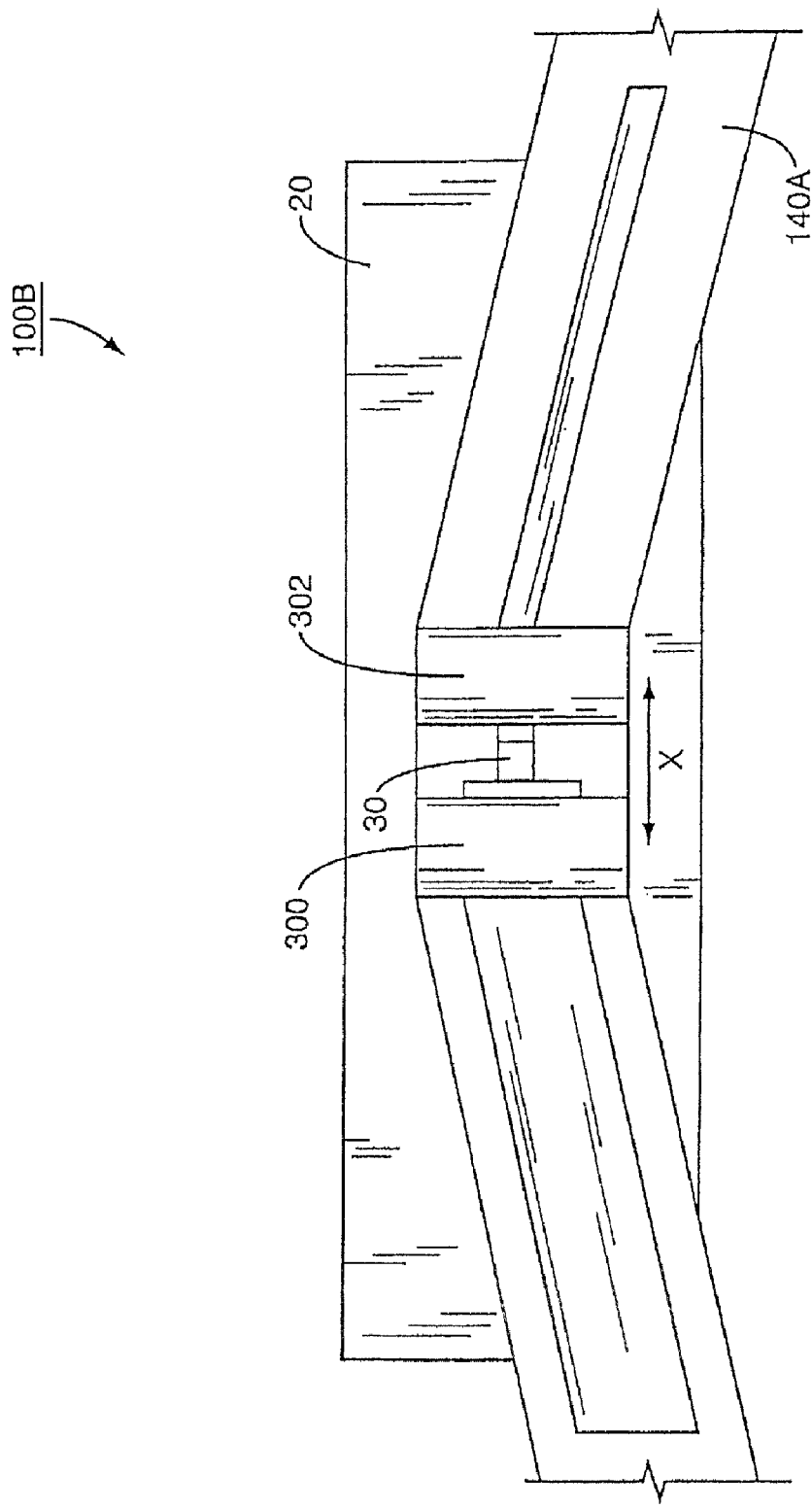
FIG. 11 illustrates a top view of the third cutting technique of FIG. 10.
Figure 12:
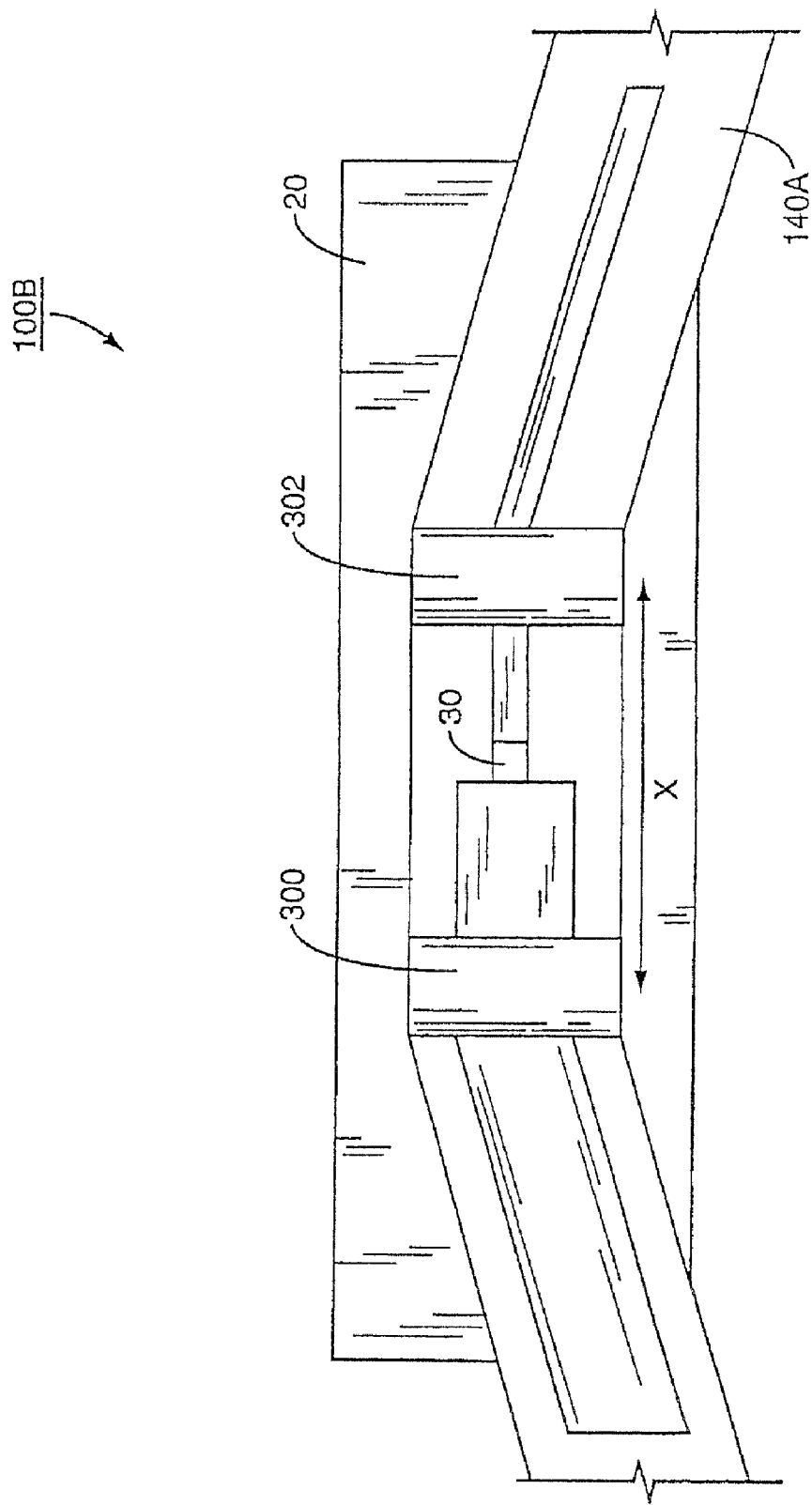
FIG. 12 illustrates a top view of the third cutting technique of FIG. 10 with the rollers spread.
Figure 13A:
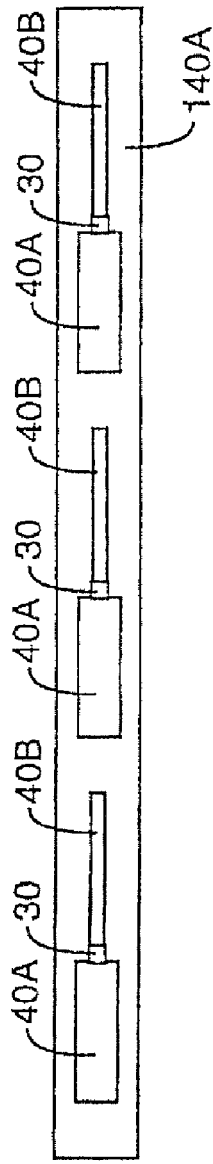
FIGS. 13A and 13B illustrate top views of the tape before and after cutting in the process of FIGS. 10-12.
Figure 13B:
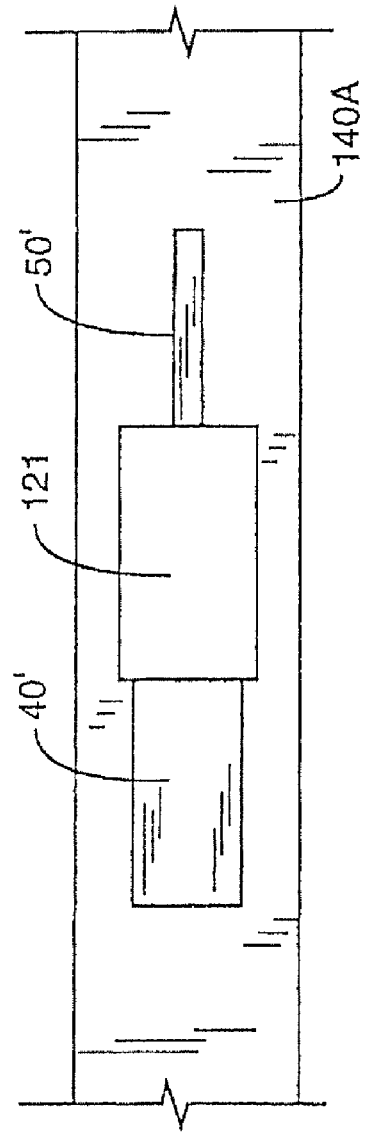

As illustrated by the difference between FIGS. 11 and 12, rollers 300, 302 may be spread if larger tabs 40A, 40B are required. After the testing equipment determines that the tabs 40 are appropriately sized to give the desired performance to antenna 60, a cut is made and tabs 40A, 40B are mounted on substrate 20. This cut may be made with a die, a knife, a laser, or other appropriate cutting tools (none shown). It may be desirable to test capacitance by changing one and then the other tab 40A, 40B as needed or desired. As can be seen in FIG. 13B, the cut removes tabs 40A, 40B and a portion of the backing material 130 to create hole 121, leaving tab residuals 40', 50'.

As previously noted, some of the above techniques may be occurring concurrently with the positioning of the chips 30 on the adhesive line 118. The following section deals with mounting the chips 30 on the wireless communication device 10 after the antenna 60 has been positioned thereon.

Mounting Techniques

Figure 14:
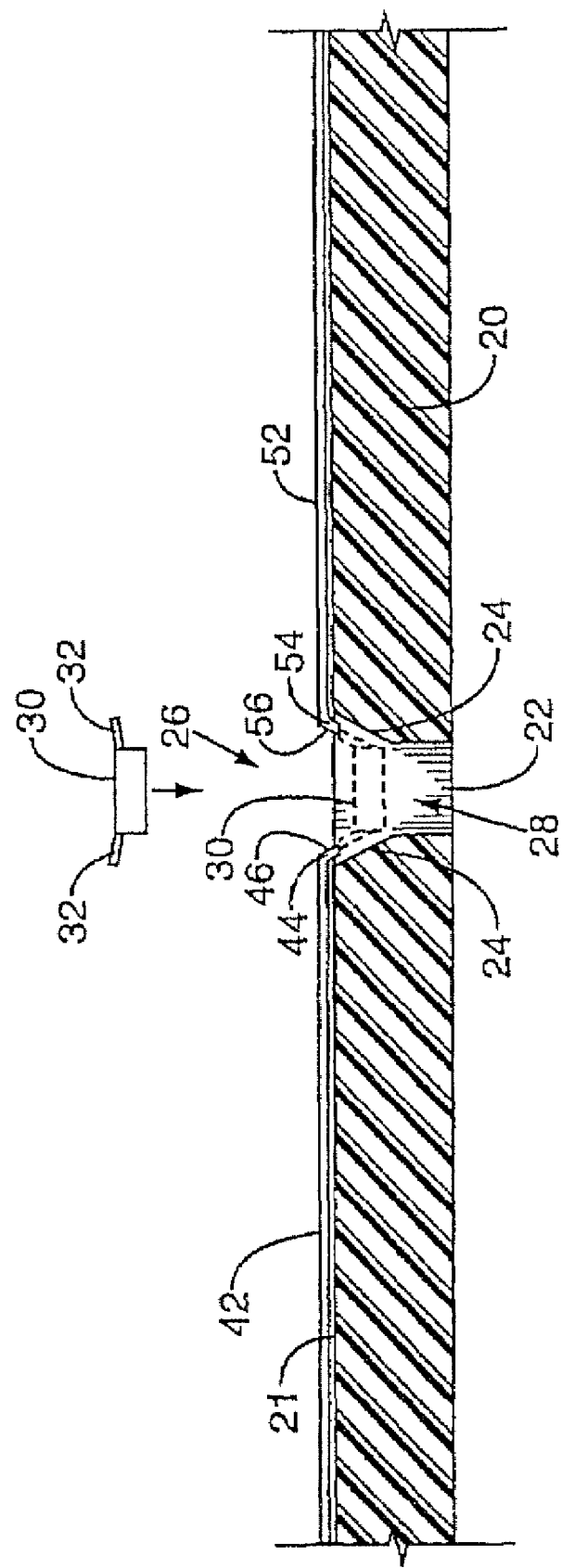
FIG. 14 illustrates a first cross-sectional view of a positioning technique for a chip to be used in a wireless communication device.

One technique is illustrated in FIG. 14. In particular, a hole 22 is punched into substrate 20. Hole 22 is any type of cavity in substrate 20 or any type of geometry such that wireless communication chip 30 may be wholly or partially placed inside such cavity. Hole 22 may have tapered top edges 24 that taper from a wide opening 26 to a narrow mouth 28. The size of narrow mouth 28 may be the same or smaller in size than the width of wireless communication chip 30, so that wireless communication chip 30 rests in hole 22 at the point where narrow mouth 28 begins.

Foil tape 42, 52 overlaps edges 24 so that tape 42, 52 extends partially into hole 22. Chip 30 is then inserted in the direction of the arrow into the hole 22. Hole 22 may be designed to allow chip 30 to sit flush with upper surface 21 of substrate 20 without substantially protruding therefrom, as is illustrated in FIG. 14. This reduces the profile of substrate 20 and protects chip 30 from some inadvertent harm. Hole 22 may also be designed to allow chip 30 to sit fully below upper surface 21 or to protrude slightly from hole 22 depending on the design and size of hole 22, edges 24, and mouth 28.

A number of techniques exist to attach chip 30 to tabs 40A, 40B. A first technique comprises using a low melting point solder. Tape ends 44, 54 of foil tape 42, 52 may be pre-loaded with a solder paste. Chip 30 is then simply dropped onto the paste (not shown), and the solder (not shown) is melted to form connectivity between tabs 40A, 40B and chip 30. Appropriate methods to form the solder joint comprise the use of infrared radiation to heat the joint locally, or pushing chip 30 into the paste with pins 32 of chip 30 preheated. Preheating of pins 32 allows the solder to remain in a liquefied state longer after initial melting so that solder may more easily flow to more surface area of tabs 40A, 40B and around pin 32 to form a stronger bond. Such preheating may be accomplished by any technique, including use of a preheating tool that emits heat such as a hot gas jet or the like.

An alternative technique for attaching chip 30 to tabs 40A, 40B comprises the use of a conductive adhesive (not shown). The adhesive forms a bond between tabs 40A, 40B and chip 30, and the conductivity of the adhesive ensures electrical continuity between tabs 40A, 40B and chip 30. Either a suitable conductive adhesive can be applied by printing to ends 44, 54 of tape 42, 52 prior to assembly, or chip 30 may be pushed onto a pressure sensitive conductive adhesive on top surfaces 46, 56 of tape 42, 52. It may be advantageous, but not required to use an adhesive that can be cured rapidly. For example, an adhesive cured by a flash of ultraviolet (IV) light would be appropriate. Examples of conductive adhesives include isotropic conductive adhesives, conductive silicones, and anisotropic conductive adhesives. The interested reader is directed to *Electrically Conductive Adhesives Characteristics and Applications*, a Loctite Corporation publication available at www.loctite.com that is hereby incorporated by reference in its entirety. Further information may also be found at the following website: www.chemical.felpro.com/electronics/elec_tech_index.html#eleccond.

Figure 15:
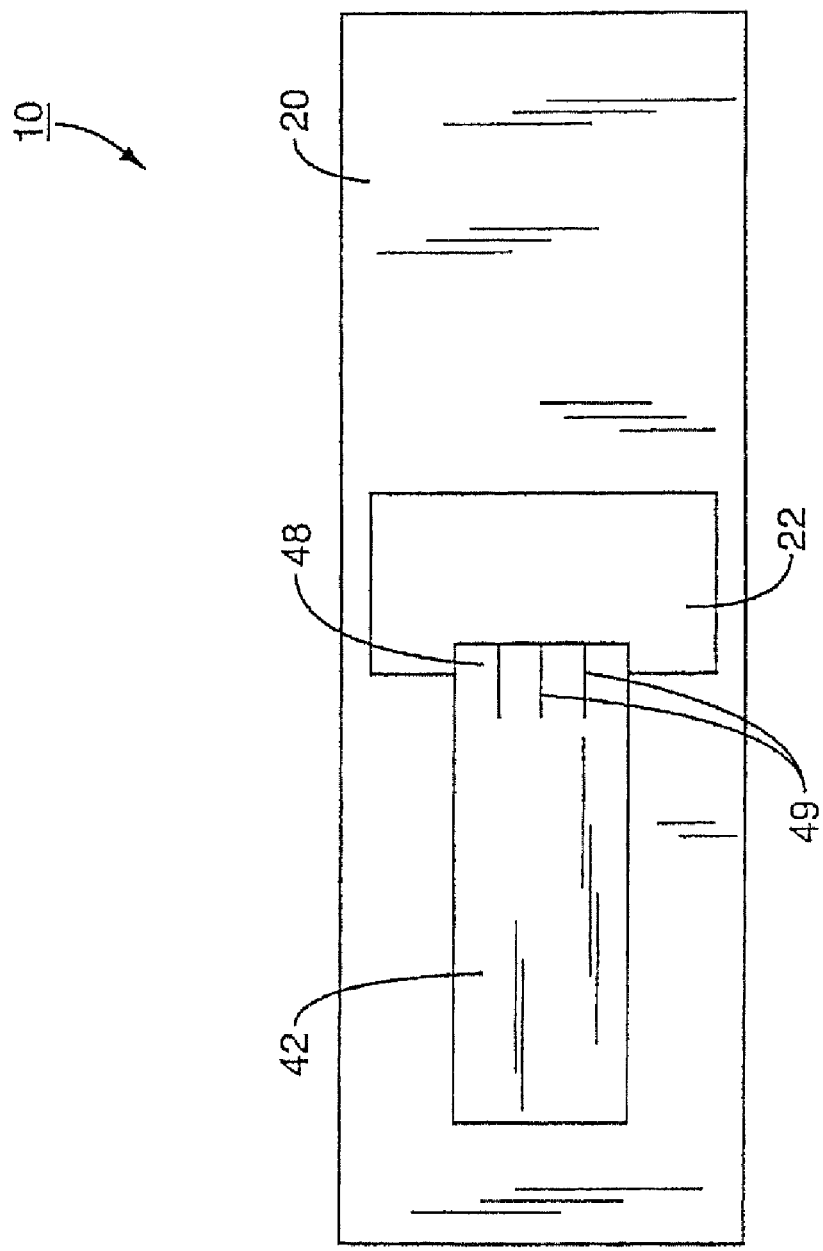
FIG. 15 illustrates a top plan view of an antenna element positioned on a substrate.
Figure 16:
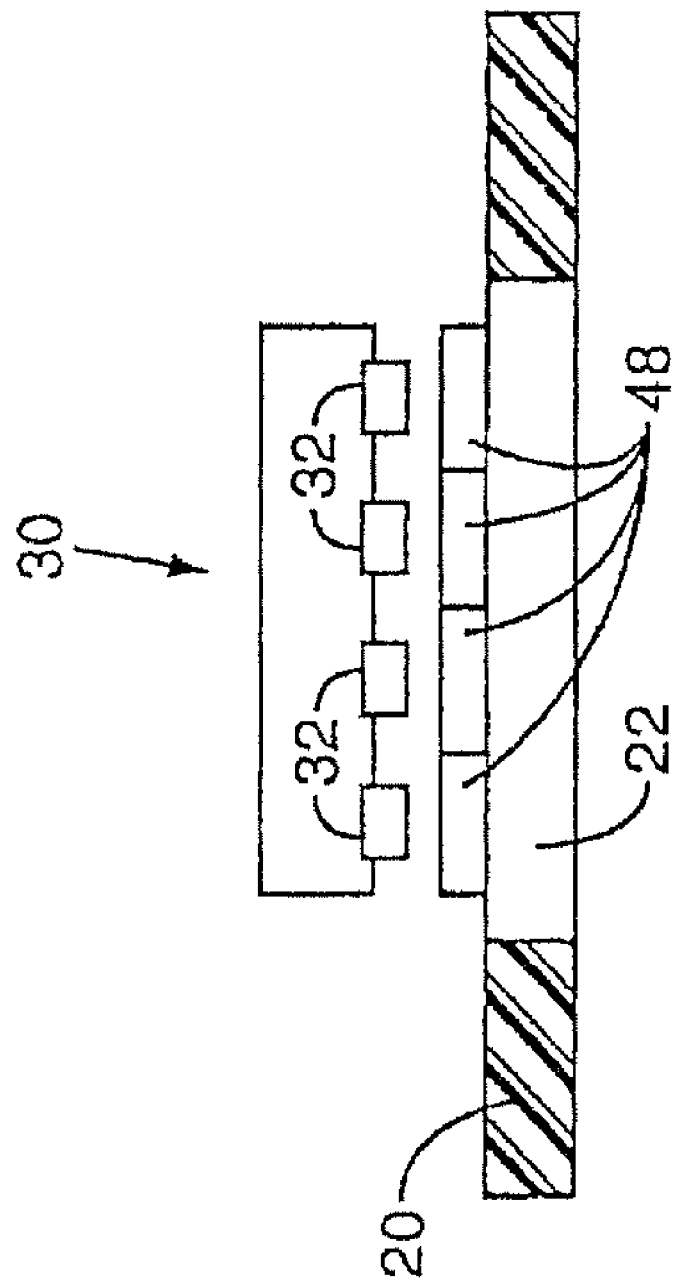
FIG. 16 illustrates a side view of the antenna element of FIG. 15 with a chip positioned above it prior to positioning.
Figure 17:
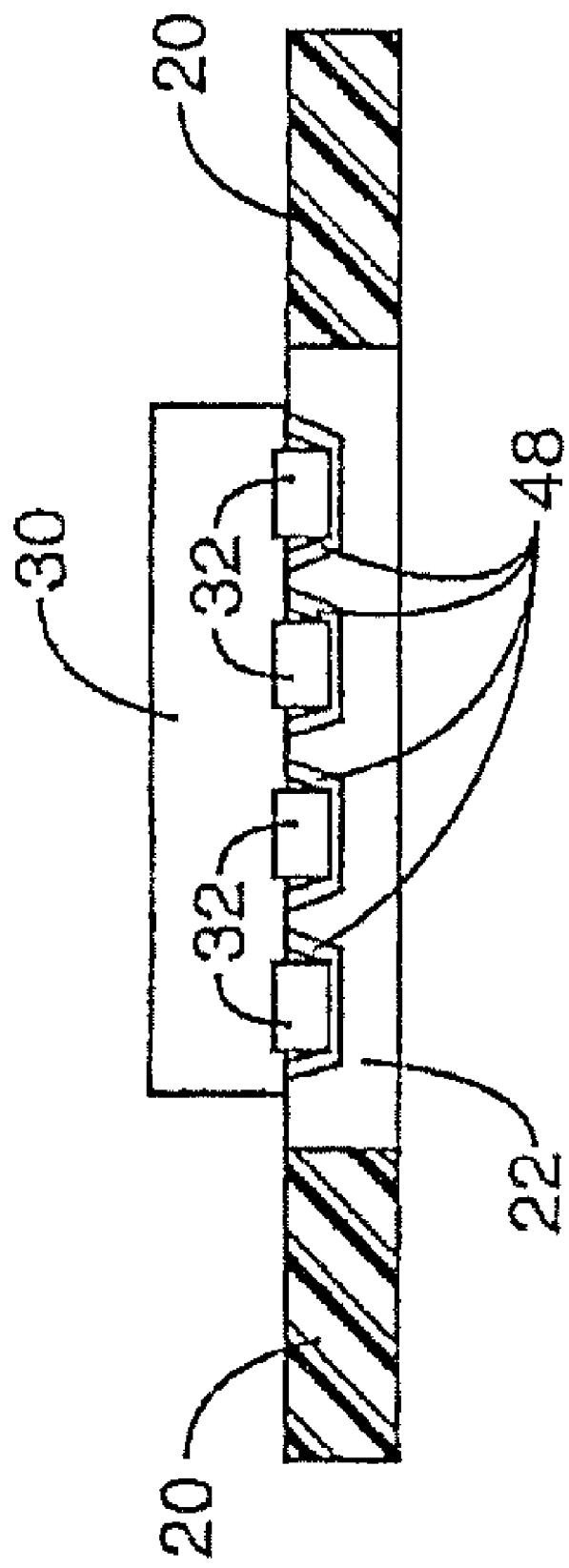
FIG. 17 illustrates a side view of the antenna element of FIG. 16 with the chip positioned.

Yet another alternative is illustrated in FIGS. 15-17. In this embodiment, the tape 42 has one end sliced into a plurality of fingers 48. Note that the fingers 48 are made from the same material as the tape 42, but include cuts 49 between the fingers 48. The fingers are then placed proximate the hole 22. A top view of the tape 42, the fingers 48, and an exemplary positioning relative to the hole 22 is illustrated in FIG. 15. With that arrangement in place, it is now possible to mount the chip 30.

Chip 30, and particularly pins 32 thereof, are heated above the yield point of substrate 20 and positioned over substrate 20 (FIG. 16). Pins 32 are then forced into substrate 20 with fingers 48 wrapping around pins 32, as illustrated in FIG. 17. The heat of pins 32 melts substrate 20, which then cools around tape 42 and pins 32 forming an effective mechanical bond. Also note that this technique could also be done on the other tab 40B (not shown) in a similar fashion. Note that both tabs 40A, 40B should be in place prior to this insertion.

Still another alternative would be to weld or tack pins 32 to tape 42, 52 using a suitable tool. The tool presses chip 30 into surface 21 of substrate 20. A high current may be passed through pins 32, using a low voltage pulse therethrough to form the weld. A lower voltage pulse is desirable so as to not apply a damaging voltage to chip 30. A modified chip 30 with a single thin foil (not shown) rather than multiple pins 32 may also be used for this technique. This technique may be better suited for chips 30 having an aluminum thin foil rather than a copper thin foil, since aluminum has a melting point temperature lower than copper thereby allowing use of a current that is lower in Amperes.

With all of these embodiments, a sealing layer (not shown) may also be placed onto substrate 20 and over chip 30 to hold chip 30 firmly in its desired location. This sealing layer may be an epoxy, but may instead be a robust plastic such as polyimide, Mylar, or polypropylene. These plastics may be attached by adhesives or by thermal welding as needed or desired.

It should be noted that extra layers may be added to wireless communication device 10 after or in place of the sealing layer. For example, a paper layer for printing or plastic layers may be added to the structure. Such sealing layer or layers may be applied onto substrate 20 using any type of label printing machine.

Figure 18:
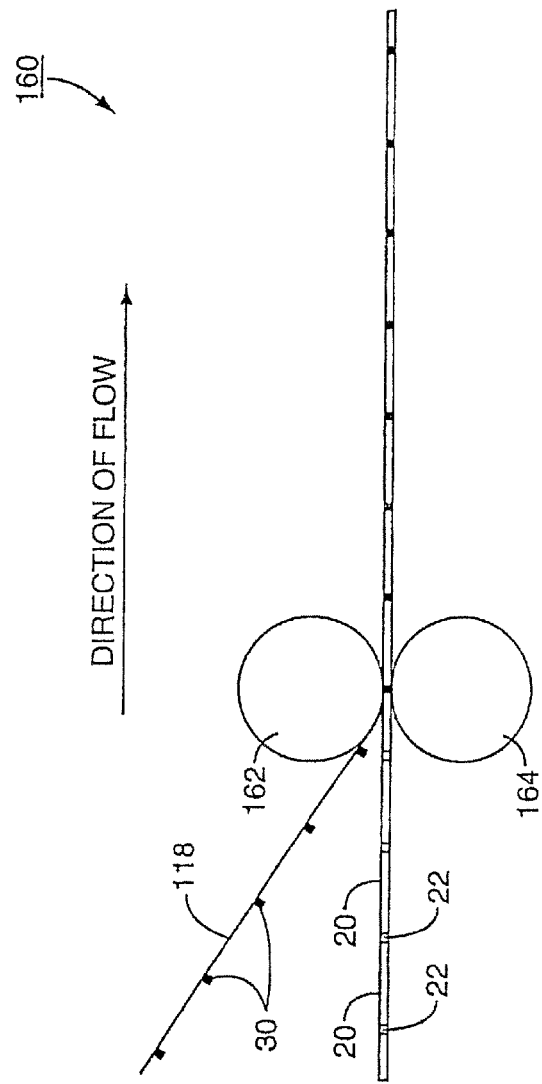
FIG. 18 illustrates an exemplary roller technique to attach the chips to the substrate of the wireless communication device.
Figure 19:
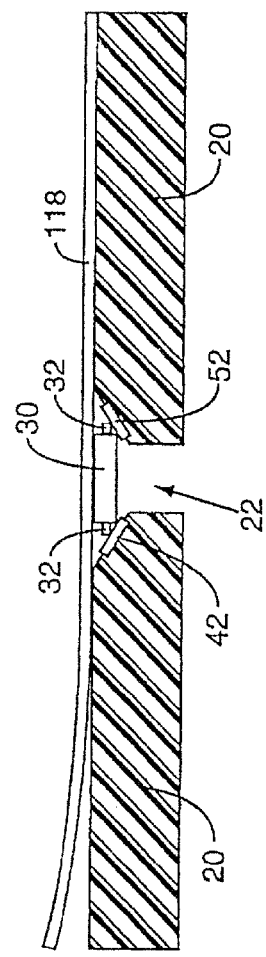
FIG. 19 illustrates a more detailed view of the chip being attached to the substrate.

For almost any of the above styled processes, the chip 30 may be positioned on the substrate 20 with rollers as illustrated in FIGS. 18 and 19. Chip merging system 160 is illustrated schematically in FIG. 18 and comprises a first and second heat and pressure roller 162, 164. These rollers 162, 164 may perform the thermal welding alluded to above. Adhesive line 118 with chips 30 disposed thereon passes between rollers 162, 164 and mates with substrate 20, and particularly hole 22 of substrate 20 as better seen in FIG. 19. Tabs 40 have been prepositioned on substrate 20 prior to the introduction of the chip 30 thereto. Chip 30 may be secured to the tabs 40 and the substrate 20 by any of the means previously discussed as needed or desired.

The above-mentioned techniques are useful with a number of other manufacturing techniques. Of particular interest is the creation of tabs 40A, 40B. This may be done before, concurrently with, or after the creation of hole 22 in substrate 20 as needed or desired.

Figure 20:
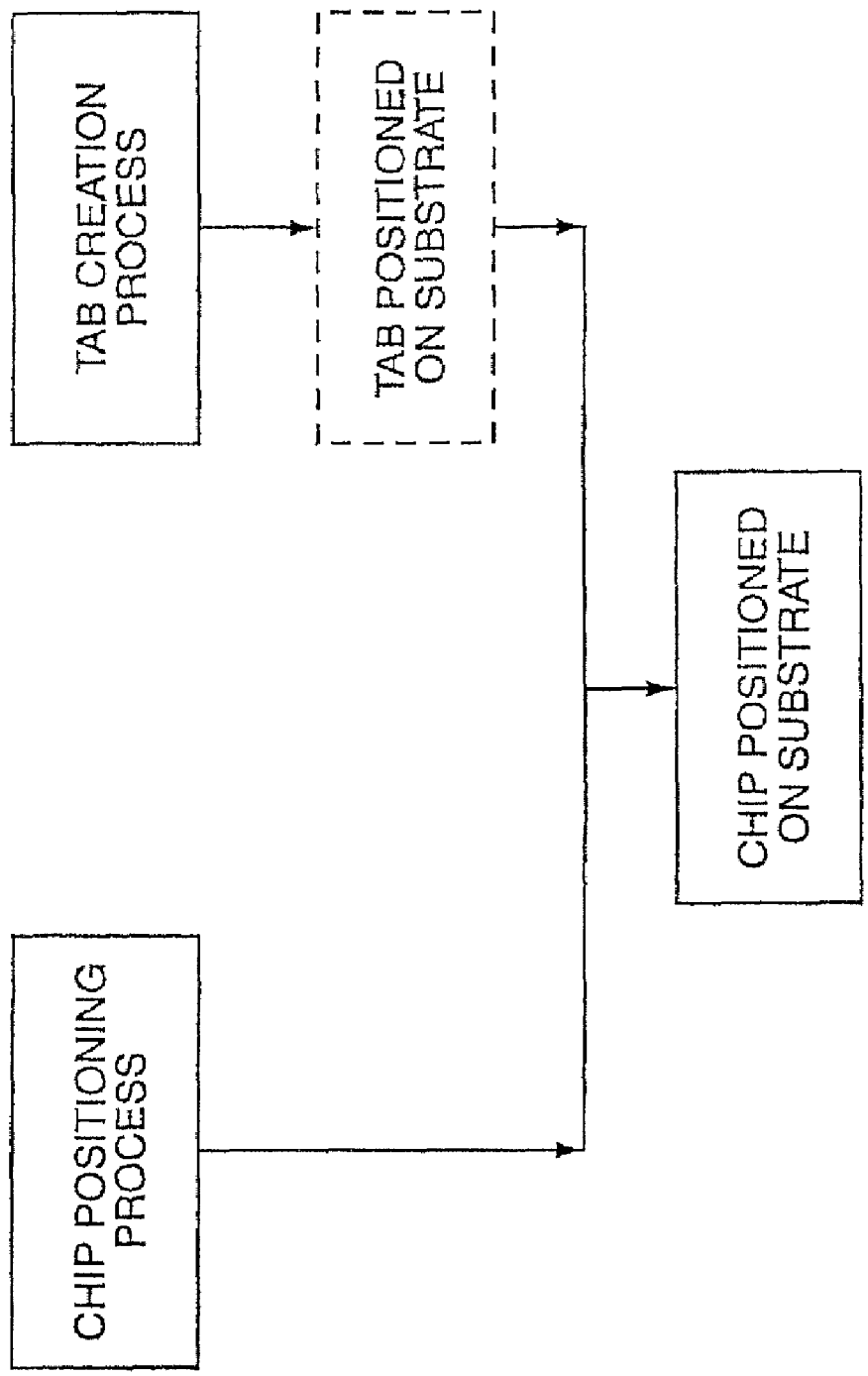
FIG. 20 illustrates an exemplary block diagram of an entire production process using the techniques of the present invention.

The present invention is well suited for "roll to roll" processes, making the automation of the present invention easy. As illustrated in FIG. 20, the chip 30 positioning process may be occurring concurrently with the tab 40 creation process. The tabs are then positioned on the substrate 20 through an appropriate means as is well understood. Finally the two production lines merge and the chip 30 may be positioned on the substrate 20. Furthermore, the automation may test and mark defective parts as needed or desired.

The present invention may, of course, be carried out in other specific ways than those herein set forth without departing from the scope and the essential characteristics of the invention. The present embodiments are therefore to be construed in all aspects as illustrative and not restrictive and all changes coming within the meaning and equivalency range of the appended claims are intended to be embraced therein.

What is claimed is:

1. An apparatus for producing a wireless communication device, comprising:
    a cutting tool configured to cut a conductive tab for use as an antenna element, wherein the cutting tool is positionable relative to the tab to permit adjustable cutting of the tab to obtain a desired electrical characteristic for the antenna element; and
    a mounting tool configured to secure a wireless communication chip to the tab and a substrate, thereby forming the wireless communication device, wherein the mounting tool includes a heater configured to heat pins of the wireless communication chip to a temperature above a yield point of the substrate so that the pins melt the substrate when inserted into the substrate.

2. The apparatus of claim 1, wherein the cutting tool comprises:
    means for adjustably cutting a first tab for use as a first antenna element; and
    means for adjustably cutting a second tab for use as a second antenna element;
    wherein the mounting tool further includes means for securing the first and second tabs to wireless communication chip and the substrate.

3. The apparatus of claim 2, wherein the means for adjustably cutting the first and second tabs comprise at least two independently positionable rollers.

4. The apparatus of claim 3, wherein the two independently positionable rollers are configured to receive a production line comprising a backing material having tabs and a wireless communication chip disposed thereon.

5. The apparatus of claim 3, wherein the means for adjustably cutting the first and second tabs comprise cutting means to cut the backing material around the chip and through the tabs.

6. The apparatus of claim 5, further comprising a radiator that assesses the capacitance of the first and second tabs prior to cutting to determine an appropriate size for the cut made by the cutting means.

7. The apparatus of claim 2, wherein the means for adjustably cutting the first and second tabs comprise three rollers, each roller configured to make a cut on a production line.

8. The apparatus of claim 7, wherein a first of the three rollers is configured to make a cut that comprises an interior portion of the first and second antenna elements.

9. The apparatus of claim 8, wherein a second of the three rollers is configured to make a cut that comprises an exterior portion of one of the first and second antenna elements.

10. The apparatus of claim 9, wherein a third of the three rollers is configured to make a cut that comprises an exterior portion of the other of the first and second antenna elements.

11. The apparatus of claim 7, wherein the three rollers are phased to vary selectively the size of the first and second antenna elements.

12. The apparatus of claim 2, wherein the means for securing the first and second tabs to the wireless communication chip comprises an adhesive.

13. The apparatus of claim 2, wherein the means for securing the first and second tabs to the wireless communication chip comprises a hot gas jet configured to heat pins of the wireless communication chip prior to coupling to fingers cut into the first and second tabs.

14. The apparatus of claim 1, wherein the cutting tool is further configured to receive a production line carrying a series of conductive tabs.

15. The apparatus of claim 1, wherein the cutting tool is a first cutting tool, the apparatus further comprising a second cutting tool configured to cut a second tab for use as a second antenna element, wherein the second cutting tool is positionable relative to the second tab to permit adjustable cutting of the tab to obtain a desired electrical characteristic for the second antenna element, and wherein the mounting tool is further configured to secure the wireless communication chip to the second tab.

16. The apparatus of claim 15, wherein the electrical characteristic is impedance, and wherein the second cutting tool is positionable to permit cutting the second tab with an impedance that matches an impedance of the wireless communication chip.

17. The apparatus of claim 1, wherein the mounting tool is further configured to secure the wireless communication chip to the substrate via insertion of the wireless communication chip into a cavity in the substrate.

18. The apparatus of claim 17, wherein the wireless communication chip is configured to fit inside the cavity such that a surface of the wireless communication chip is coplanar with a surface of the substrate.

19. The apparatus of claim 1, wherein the heater is further configured to heat pins of the wireless communication chip for inserting the pins into a solder paste configured to melt and later harden to secure the wireless communication chip to the tab.

20. The apparatus of claim 19, wherein the tab is preloaded with the solder paste.

21. The apparatus of claim 1, wherein the mounting tool is further configured to use an adhesive to secure the wireless communication chip to the tab and the substrate.

22. The apparatus of claim 21, wherein the adhesive is conductive.

23. The apparatus of claim 21, wherein the adhesive is a rapidly curing adhesive.

24. The apparatus of claim 1, wherein the heater is a hot gas jet.

25. The apparatus of claim 1, wherein the heater is configured to heat the pins using infrared radiation.

26. The apparatus of claims 1, wherein the tab is further configured with fingers that wrap around the pins when the pins are inserted into the substrate.

27. The apparatus of claim 1, wherein the melted substrate forms a mechanical bond around the pins of the wireless communication chip upon cooling.

28. The apparatus of claim 1, wherein the mounting tool further comprises a welder configured to pass a high-current, low-voltage electrical pulse through pins of the wireless communication chip to weld the pins of the wireless communication chip to the substrate.

29. The apparatus of claim 1, wherein the mounting tool further comprises a welder configured to pass a high-current, low-voltage electrical pulse through a thin foil that melts and secures the wireless communication chip to the substrate.

30. The apparatus of claim 1, wherein the mounting tool is further configured to place a sealing layer over the substrate and the wireless communication chip to securely hold the wireless communication chip on the substrate.

31. The apparatus of claim 30, wherein the sealing layer comprises a plastic layer.

32. The apparatus of claim 30, wherein the sealing layer comprises an epoxy layer.

33. The apparatus of claim 1, wherein the electrical characteristic is impedance.

34. The apparatus of claim 33, wherein the cutting tool is positionable to permit cutting of the first tab with an impedance that matches an impedance of the wireless communication chip.

35. The apparatus of claim 1, wherein the electrical characteristic is capacitance.

36. The apparatus of claim 1, wherein the electrical characteristic is configured to affect an operating frequency of the antenna element.

37. The apparatus of claim 1, wherein the cutting tool comprises at least one of a die, a knife, or a laser.

38. An apparatus for producing a wireless communication device, comprising:
- a cutting tool configured to cut a conductive tab for use as an antenna element, wherein the cutting tool is positionable relative to the tab to permit adjustable cutting of the tab to obtain a desired electrical characteristic for the antenna element; and
- a mounting tool configured to secure a wireless communication chip to the tab and a substrate, thereby forming the wireless communication device, wherein the mounting tool includes a heater configured to heat pins of the wireless communication chip for inserting the pins into a solder paste configured to melt and later harden to secure the wireless communication chip to the tab.

39. The apparatus of claim 38, wherein the tab is preloaded with the solder paste.

40. An apparatus for producing a wireless communication device, comprising:
- a cutting tool configured to cut a conductive tab for use as an antenna element, wherein the cutting tool is positionable relative to the tab to permit adjustable cutting of the tab to obtain a desired electrical characteristic for the antenna element; and
- a mounting tool configured to secure a wireless communication chip to the tab and a substrate, thereby forming the wireless communication device, wherein the mounting tool includes a welder configured to pass a high-current, low-voltage electrical pulse through pins of the wireless communication chip to weld the pins of the wireless communication chip to the tab.

41. An apparatus for producing a wireless communication device, comprising:
- a cutting tool configured to cut a conductive tab for use as an antenna element, wherein the cutting tool is positionable relative to the tab to permit adjustable cutting of the tab to obtain a desired electrical characteristic for the antenna element; and
- a mounting tool configured to secure a wireless communication chip to the tab and a substrate, thereby forming the wireless communication device, wherein the mounting tool includes a welder configured to pass a high-current, low-voltage electrical pulse through a thin foil that melts and secures the wireless communication chip to the tab.

* * * * *

UNITED STATES PATENT AND TRADEMARK OFFICE
CERTIFICATE OF CORRECTION

| | |
|---|---|
| PATENT NO. | : 7,730,606 B2 |
| APPLICATION NO. | : 11/468749 |
| DATED | : June 8, 2010 |
| INVENTOR(S) | : I. J. Forster et al. |

Page 1 of 1

It is certified that error appears in the above-identified patent and that said Letters Patent is hereby corrected as shown below:

| COLUMN | LINE | ERROR |
|---|---|---|
| 9 (Claim 2, | 32 line 8) | "second tabs to wireless" should read --second tabs to the wireless-- |
| 10 (Claim 26, | 49 line 1) | "claims 1," should read --claim 1,-- |

Signed and Sealed this
Eighth Day of March, 2011

David J. Kappos
*Director of the United States Patent and Trademark Office*